United States Patent [19]
Cain

[11] Patent Number: 5,624,582
[45] Date of Patent: *Apr. 29, 1997

[54] OPTIMIZATION OF DRY ETCHING THROUGH THE CONTROL OF HELIUM BACKSIDE PRESSURE

[75] Inventor: John L. Cain, Schertz, Tex.

[73] Assignee: VLSI Technology, Inc., San Jose, Calif.

[*] Notice: The term of this patent shall not extend beyond the expiration date of Pat. No. 5,342,476.

[21] Appl. No.: 219,337

[22] Filed: Mar. 28, 1994

Related U.S. Application Data

[63] Continuation-in-part of Ser. No. 7,348, Jan. 21, 1993, Pat. No. 5,342,476, and Ser. No. 130,062, Sep. 30, 1993, abandoned.

[51] Int. Cl.[6] .................................................. H01L 21/306
[52] U.S. Cl. ........................... 438/715; 216/67; 438/723; 438/721
[58] Field of Search .................................. 156/643, 646; 437/228, 248, 943; 148/DIG. 131; 118/719; 216/41, 58, 59, 82, 83, 96, 99

[56] References Cited

U.S. PATENT DOCUMENTS

| | | | |
|---|---|---|---|
| 4,385,937 | 5/1983 | Ohmura | 437/17 |
| 4,565,601 | 1/1986 | Kakehi et al. | 156/643 |
| 4,709,655 | 12/1987 | Van Mastrigt | 118/719 |
| 4,999,320 | 3/1991 | Douglas | 148/DIG. 131 |
| 5,096,536 | 3/1992 | Cathey, Jr. | 156/643 |
| 5,164,034 | 11/1992 | Arai et al. | 156/643 |
| 5,203,558 | 4/1993 | Arai et al. | 156/643 |
| 5,342,476 | 8/1994 | Cain | 156/643 |

OTHER PUBLICATIONS

Wolf et al., "Silicon Processing for the VLSI Era," vol. 1, Lattice Press, Sunset Beach, California, 1986, pp. 384–393, 557–558.

Primary Examiner—Kevin M. Picardat
Attorney, Agent, or Firm—Burns, Doane, Swecker & Mathis, L.L.P.

[57] ABSTRACT

In a dry non-isotropic etching process, backside cooling by helium controls the rate and uniformity of etching in a thermal silicon layer, the taper of profiles etched into silicon dioxide layers, and the dimension and uniformity of etched structures in a polycide or polysilicon layer, on the surface of a silicon wafer. Helium pressures from greater than 2 torr to more than 10 torr are satisfactorily utilized to produce these effects.

21 Claims, 1 Drawing Sheet

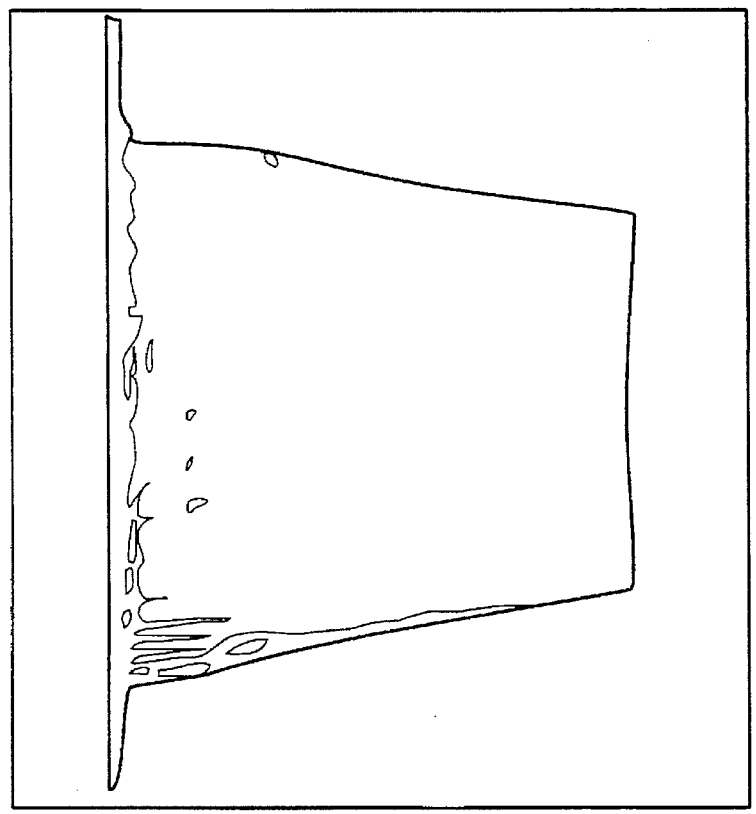
FIG._1B
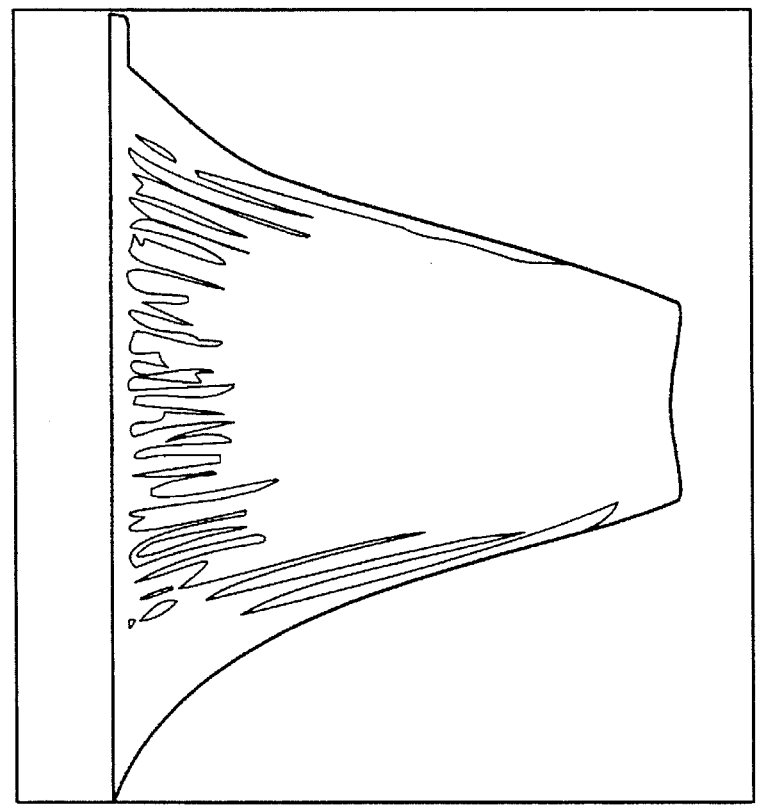
FIG._1A

OPTIMIZATION OF DRY ETCHING THROUGH THE CONTROL OF HELIUM BACKSIDE PRESSURE

This is a continuation-in-part of application Ser. No. 08/007,348, filed Jan. 21, 1993 now U.S. Pat. No. 5,342,476; and a continuation-in-part of application Ser. No. 08/130,062, filed Sep. 30, 1993 (Attorney Docket No. 029300-226, VLSI No. 1717) now abandoned.

FIELD OF THE INVENTION

This invention relates to the dry etching of oxide and polycide layers on the surface of a silicon wafer during fabrication of the semiconductor devices.

BACKGROUND OF THE INVENTION

The formation of non-isotropic patterns (i.e., essentially vertical etch profiles) on the surface of silicon wafers is essential when the thickness of the film being etched is comparable to the minimum pattern dimensions of the to-be-formed features. For example, in very large scale integration (VLSI) devices, many of the films have thickness on the order of about 0.5 to 1 microns (μm) whereas the to-be-formed patterns are on the order of about 1 to 2 μm. Accordingly, undercutting which accompanies typical isotropic etching methods (e.g., wet etching) becomes intolerable at these dimensions. See, for example, Wolf, "Silicon Processing for the VLSI Era", Vol. 1, Chapter 16 ("Dry Etching for VLSI Fabrication"), Lattice Press, Sunset Beach, Calif. (1986).

In view of the above, dry non-isotropic etching procedures have been developed to transfer such patterns onto silicon wafers including, by way of example, reactive ion etching, reactive ion beam etching, electron beam etching, plasma etching, and the like. Common to such dry non-isotropic etching procedures is the use of a reaction chamber wherein the silicon wafer to be etched is placed in a wafer holder. In addition to holding the wafer, the wafer holder is also used to maintain a constant wafer temperature which, among other factors, is important to ensure constant etch rates on the wafer. Typically, the wafer is maintained between −20° and 60° C. during dry non-isotopic etching and, if the wafer temperature is uneven over its surface, then areas of the wafer which are at higher temperatures will tend to etch faster then areas of the wafer maintained at lower temperatures. In turn, uneven etch rates can provide for undesirable uneven patterning which can reduce the degree of non-isotropic etching.

Suitable wafer holders include electrodes (which can impart a low level of heat to the wafer to maintain constant wafer surface temperatures); inert materials (which can act as a heat sink during non-isotropic etching to maintain constant wafer surface temperatures); and the like. In general, a stream of helium gas is permitted to flow to the backside of the wafer holder (the surface of the holder opposite the wafer) to further ensure constant wafer temperature which procedure is referred to as "backside cooling".

Notwithstanding the advantages of dry non-isotropic etching, serious problems with underetching and particulate formation are encountered when such etching is employed to remove polycides from the wafer surface. Specifically, refractory metal polycides (e.g., tungsten silicide ($WSi_2$), molybdenum silicide ($MoSi_2$), and the like) are employed at numerous sites of the to-be-formed circuits elements including, by way of example, metal interconnect technology, Si-gate technology, and the like, because such silicides have lower resistance, i.e., sheet resistance, as compared to polysilicon. In turn, lower sheet resistance permits the semiconductor device to be operated under faster real time conditions thereby enhancing the operating speed of the device.

In forming a layer of refractory metal polycide on the surface of such circuit elements, a layer of refractory metal or refractory metal silicide is first deposited over the entire surface of the wafer. When a refractory metal is deposited, the metal is then converted to a metal silicide by conventional methods such as thermal annealing. In either case, a layer of resist is then patterned over the surface of the wafer so as to define the to-be-formed circuit elements containing a surface of metal silicide. Next, the wafer surface is subjected to dry non-isotropic etching so as to remove the metal silicide in all areas except under the resist. Upon removal of the resist layer, a surface layer of metal silicide is found only at the desired circuit features.

It has been found, however, that the dry non-isotropic etching of the metal silicide layer on the surface of a silicon wafer utilizing backside cooling results in underetching of the wafer coupled with gross residues across the wafer surface. Both phenomena are severely deleterious to the effectiveness of the etch process as well as the wafer produced thereby. Specifically, underetching of the wafer surface and particulate contamination on the surface of the wafer can alter the functionality of the to-be-formed circuit elements.

The basic sequence of steps involved in the formation of a metal-to-silicon contact structure for an integrated circuit comprises the steps of:

Forming heavily doped regions which extend relatively deeply into the silicon in locations where contacts are to be established;

forming a thermal oxide or CVD-oxide layer on the surface of the fabricated or partially fabricated integrated circuit device;

etching a window, or contact hole, in the silicon-oxide layer by wet or dry etching techniques;

cleaning the silicon surface to remove any native oxide-layer that is known to rapidly form on a silicon surface when it is exposed to an oxygen-containing ambient;

depositing a metal film on the surface which makes contact with the silicon wherever contact holes have been created in the oxide, the deposited metal is typically aluminum or an aluminum alloy; and subjecting the contact structure to a thermal cycle known as sintering or annealing to bring the metal and silicon surfaces into intimate contact.

In the practice of this procedure, the art has sought and tried various procedures to insure that the deposited-metal films adequately cover the sidewalls of the contact windows without severe thinning, thereby achieving good-step coverage into the contact windows.

The formation of contact holes in the oxide that covers the wafer surface is a key step in the fabrication of contact structures. Two-step etch processes are often used in semiconductor processing to form contact and via holes in order to improve the aspect ratio of the hole for the subsequent deposition of metal. In conventional two-step etch processes, the first step typically consists of a wet chemical etch. The second step is typically an anisotropic plasma etch. Such a process is called a wet/dry etch. When the contact holes are larger than two microns, wet etching has often been used to open them. Even in such contact holes, however, wetting and reactant product removal can be a problem. To partially overcome the wetting problem and to insure better material flow into the vicinity of the reactant surface, mechanical or ultra-sound agitation was introduced. The isotropic nature of wet etching, however, made it ineffective for the patterning of smaller-sized contact holes. As a result, development of silicon oxide dry-etching processes had to be pursued. Alternatively, a dry-isotropic etch in a plasma-etch system is sometimes used in place of the wet-etch. Such a process is called a dry/dry etch. Dry etching, however, introduces a new set of problems including polymer contamination, damage of the silicon surface, and decrease of oxide etch rate with decrease in contact size. One consequence of the former effect was that either gases with less propensity for forming polymeric molecules would have to be found, or more complex processes to remove the polymers from the contact holes after etch would have to be developed. Dry etching also exhibited selectivity problems, which became more significant as junctions grew shallower.

In addition to the need to insure that the contact holes are opened and that silicon surface damage and contamination are minimized, it is also important to give the contact hole a shape that will result in good-step coverage by the metal that is deposited into it. In general, better step coverage will be obtained if the walls of the contact opening are sloped and the top corners are rounded. Several different approaches have been pursued to achieve these desired side-wall profiles.

The sidewall profile of a contact or via formed by conventional wet/dry or dry/dry etching has a sharp point where the isotopically etched film meets the anisotropically etched film. For small contacts of less than one micron in diameter, this can cause problems for metal step coverage in the contact or via, because the metal will tend to cusp at the sharp point and shadow any subsequent film deposition.

The sidewall profile is improved by smoothing the sharp point. This can be accomplished by high temperature reflow of the dielectric film. (However, this is not feasible if a metal such as aluminum has been deposited in a previous step, because of the low melting temperature of aluminum. Furthermore, such reflow may not be possible for sub-micron processes due to the limited thermal budget.) In reflow processes, wafers are exposed to a high temperature step after the contact holes have been opened. This causes the CVD doped-$SiO_2$ layer to flow slightly, producing rounded corners and sloped sidewalls in the contact holes. Reference is made to S. Wolfe, "Silicon Processing For The VLSI Era", Volume 2,—"Process Integration", Lattice Press, Sunset Beach, Calif., 1990, pages 101–121, the contents of which is incorporated herein in its entirety as if fully set forth in ipsis verbis. This reference is hereinafter referred to as "Reference 1".

Reference 1 at page 105 reports other sidewall-contouring processes involving an etching procedure which are used to pattern the contact holes. The first of these uses a wet etch (which is isotropic) to partially etch the oxide, and follows this with anisotropic dry etch. The method yields a contact hole whose profile is sloped at the top but is vertical at the bottom. While good step coverage can be achieved in some applications, difficulty may be encountered in obtaining good wetting, especially for very small contacts. In addition, the side-wall profile still may have a sharp corner at the upper edge which gives rise to step-coverage problems. A variation of this method is to use a triple layer (oxide/nitride/oxide). The top oxide is wet etched to provide a sloped contact-hole sidewall, and the nitride serves as a etch stop. The remaining nitride and oxide are then etched with a vertical dry-etch step.

Another general approach involves the controlled erosion of photoresist that has been baked to produce a sloped photoresist wall. In this method, photoresist images of the contacts are exposed and developed using standard lithographic techniques. Following the development step, the resist images are subjected to a post development bake of approximately 150° C. The resist flows during the bake, relaxing the vertical resist profile. Etching the resist and oxide at approximately the same rate replicates the tapered-resist profile onto the contact sidewall. While the bake-to-slope process is quite adequate for large contacts or vias greater than two microns in diameter, it is not easily scalable to smaller geometries. For such smaller contacts, resist baking steps become critical. Too little baking results in vertical contact profiles, while excessive baking can result in closed contacts. Furthermore, continued etching of the contact results in continued growth in the contact diameter.

Other more controllable resist-erosion techniques have subsequently been described. Another resist-erosion approach is reported at Reference 1, page 106. In this procedure, etching of the contact oxide is carried out with a photoresist mask that has vertical sidewalls. Oxygen is added to the $CHF_3$ gases being used to etch the oxide. The oxygen attacks the resist at a controlled rate, thereby producing lateral as well as vertical etching of the resist mask. More of the top oxide is slowly exposed as vertical etching of the oxide proceeds, and a sloped oxide sidewall is produced. Taper angles of 40 to 85 degrees were obtained by varying the oxygen concentration.

A final group of processes utilize two or more dry-etch steps to obtain tapered-sidewall profiles. In one example, a high rate isotropic oxide etch is used to etch the top portion of the contact-oxide layer, and an anisotropic etch process is used to remove the oxide from the bottom of the contact hole.

In another method, a downflow etcher operated at 2.45 $Gh_z$ is used to etch part of a doped oxide layer in a isotropic manner using a $CF_4$ plus $O_2$ mixture, and this is followed by an RIE step to give a vertical profile for the bottom portion of the layer.

The problem of end-point detection for contact holes can also be difficult. That is, if a timed etch is used, a sufficient overetch must be allowed to insure that all the contacts are opened. However, this demands a high selectivity to the silicon to prevent too much silicon from being consumed during the overetch. End-point detection is difficult because the total area of the contacts being etched is significantly smaller compared to other layers.

Turning specifically to via fabrications, one aspect of minimum feature size that applies to via fabrication is the issue of the via sidewalls. For the same contact-opening sizes at the bottom of vias, straight sidewall vias would require less area than would those with sloped sidewalls. Furthermore, when dry etching is used to open the vias, it is often easier to produce straight rather than sloped sidewalls. Unfortunately, when physical vapor deposition is used to deposit the metal over the vias, straight sidewalls result in worse step coverage by the metal than if the sidewalls were sloped. The conclusion to be drawn is that in conventional via processing, sloped vias are necessary to ensure adequate step coverage in most applications when contact holes and vias are less than about 1.5 micron wide (Reference 1, pages 188–245, the disclosure of which has been incorporated herein by reference).

In summary, the conventional process sequence for the fabrication of contacts and vias, comprises the steps of: silicon oxide layer deposition; masking of the oxide layer with photoresist; the wet or dry isotropic etching of the oxide; a dry anisotropic etching of the oxide; the stripping of the photo resist; and the reflowing of the oxide layer in a thermal cycle.

In MOS applications, the gate length is a critical fine line dimension that determines the channel length of the device. Thus, when polysilicon serves as the gate material, it is paramount that the etched line width dimension faithfully reproduces the dimension on the mask to within plus or minus five percent (5%). A polysilicon etch process must therefore exhibit excellent line width control and high uniformity of etching. In addition, a high degree of anisotropy is also generally required, as the doping of the source and the drain, and the polysilicon itself, is typically performed by ion implantation. If the etch process produces sloped sidewalls in the polysilicon, or if the etching process produces lines of non-uniform width, then portions of the gate would not be thick enough to effectively mask the substrate against the implantation. This would produce devices whose channel length depended on the degree of sidewall taper and channel lengths would not be uniform from one device to another. Unless the taper can be accurately controlled and unless the critical dimension which is the channel length is uniform from device to device, there is a serious manufacturing control problem.

The degree of anisotropy, however, is dictated by other considerations as well, including the extent of overetching required to remove stringers at the base of steep steps in the underlying topography and the coverage of the etched polysilicon features by subsequently deposited layers. In the first of these cases, completely anisotropic etching will require extensive overetching to remove the stringers, while in the second, it will produce features that may be difficult for overlying films to cover. Thus, in general, an important characteristic of a process is its ability to produce a profile with the desired degree of slope with a small standard deviation in the critical dimension.

Finally, the polysilicon layer is usually deposited over thin silicon dioxide (e.g., gate oxides of about 80–500 A thickness). Thus, the etch process must be selective over oxide etching, since if this oxide layer were removed the shallow source-drain junction regions in the underlying silicon substrate would be rapidly etched by the reactants that cause polysilicon etching. In some cases, where buried contacts between polysilicon and the single crystal substrate are made, high selectivity over single crystal silicon must be exhibited.

Some proposed processes for etching polysilicon with all of the required etching parameters, involve multi-step etching processes.

Refractory metal silicides are deposited onto to polysilicon to form a low resistance polycide structure that can serve as both a gate and an interconnect layer. In many applications, etching is used to pattern such polycide structures, but this is a difficult etching task. As in polysilicon etching, the process must provide a vertical profile on the etched polycide, good selectivity over oxide (i.e., greater than 10), and a minimal resist erosion. Etching of refractory metal silicides with both fluorine and chlorine based plasmas has been investigated, as both the fluorides and chlorides of the refractory metals are relatively volatile. Etch gases that result in high concentrations of fluorine atoms, however, are not suitable, as they tend to undercut either the polysilicon or the silicide, or both. On the other hand, fluorine-deficient plasmas can produce anisotropic etching of both the polysilicon and the silicides.

In any event, it is reported that etch profiles vary widely with process parameters, especially the gas composition. As the silicide etch rates also vary with silicide composition, the successful implementation of a polycide etching process requires stringent process controls. In addition, it has been suggested that in order to achieve a polycide etch process that produces an appropriately-shaped polycide profile, together with high selectivity over silicon dioxide, a multi-step etch process may need to be employed.

It would be advantageous if a dry etching process parameter could be identified which controls the rate and uniformity of etching in thermal silicon dioxide layers, controls the taper of profiles etched into a silicon dioxide layer and controls the dimension and uniformity of etched structures in a polycide or polysilicon layer.

SUMMARY OF THE INVENTION

This invention is directed to the unexpected discovery of the effect of backside cooling of a silicon wafer by helium gas during dry non-isotropic etching of oxide and polycide layers on the wafer surface.

It is found that in dry non-isotropic etching, backside cooling, as measured by the helium pressure at normal flow rates of helium at ambient temperature, (1) controls the rate and uniformity of etching in a silicon dioxide layer, (2) controls the taper of profiles etched into a silicon dioxide layer and (3) controls the dimension and uniformity of etched structures in a polycide or polysilicon layer, on the surface of a silicon wafer.

Accordingly, in one of its method aspects, the invention is directed to a method for increasing the rate and uniformity of silicon dioxide etching during the dry non-isotropic etching of an oxide layer on the surface of a silicon wafer which comprises:

(a) placing a patterned resist layer over the oxide layer found on the surface of said silicon wafer so as to define areas where the oxide layer is exposed and areas where the oxide layer is covered by the resist layer;

(b) placing the silicon wafer prepared in step (a) in the wafer holder of an etching reactor;

(c) removing the exposed oxide layer from the surface of the silicon wafer by dry non-isotropic etching employing wafer backside cooling by means of helium gas flow to the backside of the wafer holder, wherein the helium gas flow is adjusted to maintain a backside pressure greater than about 2 torr and less than about 10 torr.

In this method aspect, the invention is particularly useful for blanket etchback steps where the fabricator is not particularly concerned about contact profiles but is concerned about the rapidity of the etching and its uniformity. The effect of helium back pressure on the rate and uniformity of oxide etching was completely unexpected.

In another of its method aspects, the invention is directed to a method for controlling the taper of a profile etched in silicon dioxide during a dry non-isotropic etching of a silicon dioxide layer on the surface of a silicon wafer. The method comprises:

(a) placing a patterned resist layer over the oxide layer found on the surface of said silicon wafer so as to define areas where the oxide layer is exposed and areas where the oxide layer is covered by the resist layer;

(b) placing the silicon wafer prepared in step (a) in the wafer holder of an etching reactor;

(c) removing the exposed oxide layer from the surface of the silicon wafer by dry non-isotropic etching employing wafer backside cooling by means of helium gas flow to the backside of the wafer holder, wherein the helium gas flow is adjusted to maintain a backside pressure greater than 3 torr.

Preferably, the backside pressure maintained in the later method is greater than 10 torr, and most preferably, the backside helium pressure is greater than about 14 torr. Application of the later method is particularly useful in the fabrication of contacts and vias. The process is characterized by a selectivity of thermal oxide to polysilicon greater than 18:1. This dramatic increase in selectivity was totally unexpected.

In another method aspect. This invention is directed to a method for controlling the dimension and uniformity of etched structures during the dry non-isotropic dry etching of a polycide or a polysilicon layer on the surface of a silicon wafer which comprises:

(a) placing a patterned resist layer over the polycide or polysilicon layer found on the surface of the silicon wafer so as to define areas where the polycide or polysilicon layer is exposed and areas where the polycide or polysilicon layer is covered by the resist layer;

(b) placing the silicon wafer prepared in step (a) into a wafer holder;

(c) removing the exposed polycide or polysilicon layer from the surface of the silicon wafer by dry non-isotropic etching employing wafer backside cooling by means of helium gas flow to the backside of the wafer holder, wherein the helium gas pressure is greater than about 3 torr.

Preferably the helium gas pressure is greater than about 10 torr. In general, the polycide or polysilicon layer has a thickness from about 0.05 to about 1.0 microns. Preferably the polycide is tungsten silicide. The patterned resist layer is from about 0.5 to 2 microns in thickness.

In the methods of the present invention, the preferred dry etching method is a reactive ion etching. The wafer holder is an electrode containing an internal heating/cooling means and the reactive ion etching is conducted at a temperature from 20° to 60° C. utilizing organic fluoride gases, i.e., fluoromethanes with or without the addition of chlorine.

In its compositional aspects, this invention is directed to silicon wafers prepared by the methods of this invention.

BRIEF DESCRIPTION OF THE DRAWINGS

FIGS. 1A and 1B, are scanning electron microphotographs of contact profiles etched into two sample wafers at 10.0 torr of helium pressure and at 3.0 torr of helium pressure, respectively. The wafers were each resist patterned with a contact mask on top of 8,500Å of thermal oxide. The etched times were calculated based on etch rates generated previously with an overetch time of 40%. The two samples were etched as follows: The contact in FIG. 1B was etched for 157 seconds at 2.8 torr of helium back pressure. The contact in FIG. 1A was etched for 181 seconds at 10 torr of helium back pressure. The etch times include 40% overetch.

DETAILED DESCRIPTION OF PREFERRED EMBODIMENTS OF THE INVENTION

This invention is directed to the novel and unexpected discovery that among the many parameters effecting the properties of dry non-isotropic etching, the helium backside pressure is of importance.

Prior to describing this invention methodology in more detail, the following terms will first be defined:

The term "silicon wafer" refers to a section of crystalline silicon which has been polished and prepared for the fabrication of semiconductor devices upon its surface.

The term "silicon oxide", "oxide", or "thermal oxide", or "CVD-oxide"—all refer to silicon dioxide, $SiO_2$, a refractory dielectric material often appearing in layers in semiconductor devices. Although there are several ways to produce $SiO_2$ directly on a silicon surface, it is most often accomplished by thermal oxidation in which the silicon is exposed to an oxidizing ambient (e.g., $O_2$) at elevated temperatures. Thermal oxidation is capable of producing $SiO_2$ films with controlled thickness. Thermally grown $SiO_2$ found in semiconductor processing applications ranges in thickness from 60Å to 1 micron and above. CVD (chemical vapor deposited) $SiO_2$ films find wide use in semiconductor processing. It is formed, for example, by a reaction between silane and oxygen carried out in a specially adapted reactor. Reference is made to S. Wolf, et al., "Silicon Processing for the VLSI Era", Vol. 1, "Process Technology", Lattice Press, Sunset Beach, Calif., 1986, pages 198–241, the content of which is incorporated herein in it entirety as if fully set forth in ipsis verbis. This reference is hereinafter referred to as "Reference 2".

The term "semiconductor device" generally refers to any integrated circuit, or portion thereof, typically fabricated on the surface of a silicon wafer.

The term "thick silicon oxide layer" refers to a layer of silicon dioxide which is >about 1 micron in thickness, relatively uniform, and <about 2 microns in thickness.

The term "resist" or "photoresist" refers to a photosensitive material which is applied as a thin film to the substrate (e.g., $SiO_2$) and subsequently exposed through a mask containing clear and opaque features that define the pattern to be created in the resist layer. The areas in the resist exposed to the light are made either soluble or insoluble in a specific solvent known as a developer. Exposure followed by development and stripping of the photoresist gives rise to a patterned resist layer on the substrate.

The term "patterned resist layer" refers to the patterned placement of a resist layer onto the surface of a substrate (e.g., $SiO_2$) generally for purposes of etching specific structures into the substrate.

The term "dry non-isotropic etching", or "anisotropic etching", refers to an etching procedure which does not employ liquids to effect etching (hence "dry"); which etch takes place in a substantially non-isotropic manner, as opposed to the isotropic etching produced by wet etch processes. Suitable dry non-isotropic etching procedures are well known in the art and include, by way of example, reactive ion etching, reactive ion beam etching, electron beam etching, and the like. See, for example, Reference 2, pages 522 to 585, which is incorporated herein by reference.

When etching proceeds in all directions at the same rate, it is said to be isotropic. By definition, however, any etching that is not isotropic is anisotropic. If etching proceeds exclusively in one direction (e.g., only vertically), the etching process is said to be anisotropic (completely anisotropic). Many etch processes fall between the extremes of being isotropic and completely anisotropic.

The term "etchback" or "partial etch", refers to the incomplete etching of a layer of material towards which the etching process is directed. That is, if the layer of material towards which the etching is directed is one micron in thickness, the removal of 5,000Å of said layer is a partial etching or etchback.

The term "blanket etching", as used herein, refers to an etching process directed towards the entire surface of the device in a uniform manner.

The term "sputtering" is a metallic evaporation method for the deposition of metal surfaces on semiconductor devices, see Reference 2, pages 331–383, the disclosure of which is incorporated herein by reference.

The term "polycides" refers to refractory metal silicides including, by way of example, tungsten silicide ($WSi_2$), molybdenum silicide ($MoSi_2$), tantalum silicide ($TaSi_2$), titanium silicide ($TiSi_2$), platinum silicide ($PtSi$), and the like. Such silicides are well known in the art and are described, for example, by Wolf, "Silicon Processing for the VLSI Era", Vol. 1, pp. 384–405 (1986).

The preparation of films or layers of refractory metal silicides is generally accomplished by either the deposition of a layer of refractory metal followed by thermal annealing of the deposited layer to form the refractory metal silicide or by the deposition of a refractory metal silicide.

The term "wafer holder" refers to any holder conventionally employed to hold the wafer during dry non-isotropic etching. In reactive ion etching, the wafer holder is preferably an electrode containing internal coils which permit water to run therethrough.

Methodology

Formation of the Polycide Layer

In one aspect of the methods of this invention, a polycide layer is first formed onto a silicon wafer. As noted previously, the method for forming such a layer is conventional and includes sputter deposition and chemical vapor deposition of a layer or film of either a refractory metal or refractory metal silicide.

The conditions required to effect such deposition are well known in the art. For example, chemical vapor deposition [including low-pressure chemical vapor deposition (LPCVD), plasma enhanced chemical vapor deposition (PECVD), photon-induced chemical vapor deposition (PHCVD), and the like] is described by Wolf, "Silicon Processing for the VLSI Era", Vol. 1, pp. 161–197 (1986) which is incorporated herein by reference.

Suitable reaction conditions used for the deposition of refractory metals and metal silicides by CVD conditions are not critical and any suitable CVD conditions can be used. Generally, CVD conditions typically include pressures from a few millitorr to about 10 torr or slightly greater and preferably from about 75 mtorr (millitorr) to about 10 torr and even more preferably from about 100 millitorr to about 5 torr. CVD conditions also typically include reaction temperatures which are sufficient to effectively vaporize the refractory metal source materials and when desired, to allow the refractory metal so formed to concurrently deposit and adhere to the substrate. Such temperatures can generally range from about 300° C. to about 700° C. More preferably, the temperature for CVD deposition of refractory metal is from about 400° C. to about 700° C.

The specific conditions employed will vary with the particular chemical vapor deposition process used and the skilled artisan is readily capable of making the adjustments to the reaction conditions to effect deposition of the refractory metal or the refractory metal silicide.

For example, low pressure chemical vapor deposition (LPCVD) is achieved at medium vacuum (several hundred millitorr to about 10 torr), and higher temperatures (e.g., about 500° to 600° C.). LPCVD reactors successfully deposit refractory metals in a reaction rate limited regime. When the pressure is reduced sufficiently, the diffusivity of the reactant gas molecules is increased such that the mass-transfer to the substrate does not substantially limit the growth rate. Although the surface reaction rate is very sensitive to temperature, precise temperature control is relatively easy to achieve.

The use of LPCVD conditions for refractory metal deposition allows for several advantages. First, the elimination of mass-transfer constraints on reactor design allows the reactor to be optimized for high wafer capacity. Additionally, low pressure operation also decreases gas phase reactions, thus making LPCVD refractory metal films or layers less subject to particulate contamination.

Similarly, plasma enhanced chemical vapor deposition (PECVD) is a variation of chemical vapor deposition which is characterized not only by pressure, but also by its method of energy input. Rather than relying solely on thermal energy to initiate and sustain chemical reactions, the PECVD of refractory metals uses an rf-induced glow discharge to transfer energy into the reactant gases, allowing the substrate to remain at a lower temperature than in LPCVD processes.

Lower substrate temperature is one primary advantage of PECVD, and, in fact, PECVD provides a method of depositing refractory metal films or layers on substrates that do not have the thermal stability to accept coating by other methods. In addition, PECVD can enhance the deposition rate of refractory metal when compared to thermal reactions alone, and produce films or layers of unique compositions and properties. For example, a number of the desirable properties achieved by PECVD of refractory metal include good adhesion, low pinhole density, good step coverage, adequate electrical properties and compatibility with fine-line pattern transfer processes.

In a preferred embodiment, the PECVD of refractory metal films or layers controls and optimizes several deposition parameters in addition to those used in LPCVD processes, including, e.g., rf power density, frequency, and duty cycle. The deposition process is dependent in a very complex and interdependent way on these parameters, as well as on the usual parameters of gas composition, flow rates, temperature, and pressure. Furthermore, as with LPCVD, the PECVD method is surface reaction limited, and adequate substrate temperature control is thus desirable to ensure film thickness uniformity.

Photon-induced chemical vapor deposition (PHCVD) refers to the use of high-energy, high-intensity photons to either heat the substrate surface or to dissociate and excite reactant species in the gas phase. In the case of substrate surface heating, the reactant gases are transparent to the photons, and the potential for gas phase reactions is completely eliminated. In the case of reactant gas excitation, the energy of the photons can be chosen for efficient transfer of energy to either the reactant molecules themselves, or to a catalytic intermediary, such as mercury vapor.

The PHCVD of refractory metal has the advantage of allowing the deposition of refractory metal at extremely low substrate temperatures, i.e., room temperature. PHCVD-deposited metal also has the advantage of providing good step coverage. However, adequate precautions must be taken to avoid low density and molecular contamination as a result of the low deposition temperature.

When a layer of refractory metal is deposited onto the silicon wafer, the metal is then converted to refractory metal silicide by conventional methods such as thermal annealing. Thermal annealing is accomplished by art recognized methods and results in the adherence of the refractory metal silicide onto the surface of the silicon wafer. Any method for thermal annealing is acceptable under the present invention including rapid thermal annealing. When rapid thermal annealing is employed, the duration of the thermal anneal process ranges anywhere from about a few seconds to about 2 minutes and is generally accomplished at a temperature sufficient to form the silicide to no more than about 1000° C.

The thermal annealing step can be conducted in the same reaction chamber as the chemical vapor deposition (CVD) step by maintaining a sufficiently high reaction temperature (e.g., at least about 600°–650° C.) during deposition to ensure the rapid thermal annealing of the deposited refractory metal. Alternatively, the thermal annealing step can be conducted as a separate step in the CVD reaction chamber or in a reaction chamber separate and apart from the CVD reaction chamber.

In any event, the polycide formed on the surface of a silicon wafer is typically from about 0.05 to about 0.5 microns in thickness and preferably from about 0.1 to about 0.2 microns in thickness.

Placement of the Patterned Resist Layer

In the next step of the methods of this invention, a patterned resist layer is placed onto the surface of the silicon dioxide, polysilicon or polycide by conventional lithographic techniques which are well known in the art and some of which are described by Wolf, "Silicon Processing for the VLSI Era", Vol. 1, pp. 407–513, Lattice Press, Sunset Beach, Calif. (1986), the disclosure of which is incorporated by reference.

A preferred conventional method for placing a patterned resist layer on the surface of the silicon wafer includes first placing resist on the entire surface of the wafer, placing a patterned chromium mask over the wafer so as to shield the resist layer in the areas where the resist is to be maintained; exposing the wafer to UV light so as to decompose the resist thereby permitting removal of the decomposed resist by a developer solution; and as a final step, exposing the silicon wafer to the developer solution thereby retaining only the patterned resist layer on the surface of the wafer.

The resist material employed to form the patterned resist layer is not critical and any resist material conventionally employed with dry non-isotropic etching can be employed to form the patterned resist layer. Typical resist materials so employed include, by way of example, Shipley Resist (Shipley Co., Newton, Mass.) G line resist (available as TSMR 8900 from Ohka America, Inc., Milpitas, Calif.) and the like. The patterned resist layer is formed to be typically from about 0.5 to about 2 microns in thickness.

Etching of the Exposed Polycide Layer

After formation of the silicon oxide, polysilicon or polycide layer containing a patterned resist layer on the surface of the silicon wafer (both of which are conventional), the wafer is then etched under dry non-isotropic etching methods to remove the silicon oxide, polysilicon or polycide layer from all exposed areas on the silicon wafer (i.e., all areas not covered by resist). The particular dry non-isotropic etching method employed is not critical but preferably is reactive ion etching (RIE).

Reactive ion etching is conventionally conducted in an RIE reaction chamber at a temperature of from about 20° to 60° C., in a suitable etching gas pressure of about 10 to about 500 millitorr. The etching gas employed is not critical and any etching gas conventionally employed to etch polycide under reactive ion etching can be used. Suitable etching gases include, by way of example, $SF_6$, $C_2F_6$, and the like as well as mixtures of $SF_6$ and $C_2F_6$, all of which are typically employed in chlorine gas at a ratio of etching gas to chlorine of from about 1:3 to 3:1 and optionally in the presence of a small amount of oxygen (e.g., a flow of $O_2$ of from about 0 to 2 standard cubic centiment per minute of $O_2$ into the reaction chamber).

The silicon wafer containing the silicon oxide, polysilicon or polycide layer to which a patterned resist layer has been placed is conventionally placed into a wafer holder which is preferably an electrode containing internal cooling/heating means (e.g., a water coils) and means to permit helium backside cooling so as to maintain the electrode and hence the silicon wafer at a constant temperature. The wafer holder is contained or placed into an RIE reaction chamber which contains means to permit helium backside cooling of the wafer holder. RF power, typically from about 100 to about 400 watts, is then passed through the electrode to effect ion generation and hence reactive ion etching.

Reactive ion etching is continued until all of the exposed oxide, polysilicon or polycide layer is removed from the surface of the silicon wafer which typically requires from about 1 to about 5 minutes; the exact time of which is dependent on factors such as the thickness of the exposed layer, the temperature of the wafer, the extent of RF power source and the etching gas ratio.

After etching the exposed layer, the wafer is removed from the reaction chamber and the patterned resist layer is then removed by conventional techniques such as exposing the surface of the wafer to $O_2$ plasma, followed by wet treatment with hydrogen peroxide/sulfuric acid. Other methods include use of $O_2$ plasma alone, use of $O_2$ plasma with HF.

In order to further illustrate the present invention and the advantages thereof, the following specific example is given, it being understood that this example is not intended to limit the claimed invention in any manner.

It has been determined that helium backside pressure will control and dramatically effect the critical dimension of polysilicon or polycide structures. It has been confirmed that the mean and standard deviation of the critical dimension across the wafer are both effected. As helium pressure is increased the mean line width will increase. Also as helium pressure is increased, the standard deviation of the critical dimension will decrease.

It is believed that the mechanism that causes this phenomena is as follows, although the nature of this invention is not dependent upon the mechanism selected. Without helium cooling the substrate temperature rises such that any sidewall passivation will be deabsorbed readily thus causing lateral etch components to propagate. This results in loss of critical dimension control. When the helium cooling is activated, the substrate temperature is such that more sidewall polymer prevents lateral etch components from propagating and thus preserves the critical dimension.

Data to support this conclusion has been achieved on polysilicon and polycide wafers.

The standard deviation across the wafer also seems to be extremely sensitive to helium backside pressure. Without sufficient helium backside cooling, the standard deviation across the wafer typically is double that of helium with cooling of the substrate. It is believed that the helium cooling provides more uniform temperature distribution across the wafer, thus resulting in similar etch characteristics with respect to polymer deposition.

TABLE I

| WAFER #1 | HE PRESSURE | OVERETCH | P-CHANNEL MEAN CRITICAL DIMENSION | STANDARD DEVIATION |
| --- | --- | --- | --- | --- |
| 11 | 0 | 70% | 0.717 | 0.056 |
| 19 | 0 | 70% | 0.619 | 0.053 |
| 13 | 0 | 70% | 0.617 | 0.058 |
| 12 | 0 | 70% | 0.668 | 0.067 |
| 14 | 0 | 70% | 0.555 | 0.080 |
| 19 | 0 | 70% | 0.619 | 0.053 |
| 13 | 0 | 70% | 0.617 | 0.058 |
| 18 | 14 torr | 58% | 0.778 | 0.009 |
| 20 | 0 | 30% | 0.689 | 0.023 |
| 21 | 14 torr | 30% | 0.779 | 0.012 |
| 18 | 14 torr | 18% | 0.778 | 0.009 |

As is evident in Table I without helium backside cooling in the polysilicon etch process, there is a loss of critical dimension and uniformity across the wafer. Helium backside cooling is important to maintaining critical dimension control of the process. Without helium backside cooling, the critical dimension mean across the wafer was decreased from 0.779 to 0.689 (at 30% overetch) which is a loss of 0.090 microns. Without helium backside cooling, the standard deviation of the critical dimension across the wafer was increased from 0.012 to 0.023 (at 30% overetch). Without helium backside cooling, the mean critical dimension across the wafer was decreased from 0.778 to 0.619, which is a loss of 0.159 microns.

In another example of this invention, a layer of silicon dioxide greater in thickness than about one micron, and less than about two microns in thickness, is formed on the surface of the device. In general, the formation of contact windows and metalization to provide interconnects is a later stage in the fabrication of integrated circuits. The need exists to connect these structures through specific electrical paths employing highly conductive metallic films which are fabricated above an oxide insulating layer that covers the surface of the integrated circuit. It is this oxide insulating layer to which reference is now made, see Reference 1, pages 84–297, the disclosure of which is incorporated herein by reference.

The oxide layer may be formed by thermal means, or other means, such as CVD methods, as are conventional and known to the art of semiconductor device fabrication. Suitable reaction conditions for silicon oxide deposition are not critical to this invention. See Reference 2, pages 161–241.

In another embodiment of the invention, the dielectric layer of silicon dioxide separates two metal layers in the device. Holes in the dielectric layer when filled with metal permit electrical contact between the metal layers. Such holes in a dielectric layer are called "vias". The integrated circuit technology of thin film insulators and thin film conductors is described in Reference 1 at pages 176–297. As in the formation of contact holes, vias are appropriately formed and shaped by the two-step etching process of this invention by the use of a silicon oxide layer of greater thickness than that conventionally used. A silicon oxide dielectric layer >1 micron in thickness is suitable to achieve the advantages of this invention in the fabrication of vias.

In the next step, a patterned resist layer is placed onto the surface of oxide by conventional lithographic techniques well known in the art, some of which are described in Reference 2 at pages 407–513. A preferred conventional method for placing a patterned resist layer on the surface of the silicon dioxide includes first placing resist on the entire surface of the wafer, placing a patterned chromium mask over the wafer so as to shield the resist layer in the areas where the resist is to be maintained; exposing the wafer to UV light so as to decompose the resist thereby permitting removal of the decomposed resist by a developer solution; and exposing the silicon wafer to the developer solution thereby retaining only the patterned resist layer on the surface of the wafer.

The resist material employed to form the patterned resist layer is not critical, and any resist material conventionally employed with dry non-isotropic etching can be employed to form the patterned resist layer. Typical resist materials so employed include: Shipley Resist (Shipley Co., Newton, Mass.) and G-Line Resist, (available as TSMR 8900 from Ohka America, Inc., Milpitas, Calif.) and the like. The patterned resist layer is formed to be typically from about 0.5 to 2 microns in thickness.

Referring to the figures, FIGS. 1A and 1B are scanning electron microscopy (SEM) images of a silicon dioxide layer of 8,500Å thickness at contact etch structures. FIG. 1A was etched using 10 torr of helium backside cooling pressure while FIG. 1B using 3 torr of helium backside cooling pressure. The 10 torr of helium cooling produced a contact profile which is very tapered and has much polymer in evidence. It is expected that the differences in profile are a result of polymer deposition increasing during the 10 torr helium pressure etch process. As can be seen from the images, the profile is tapered dramatically at the higher helium pressure etch, however, there is polymer located at the bottom of the profile. Polymer can be removed through standard photoresist/polymer removal techniques. That polymer deposition is the mechanism for the increase of the taper observed is supported by the selectivity of thermal oxide to polysilicon as shown in Table II.

TABLE II

| HE PRESSURE | SELECTIVITY THERMAL OXIDE TO POLYSILICON | PROFILE |
|---|---|---|
| 3.0 torr | 11:1 | Anisotropic |
| 10.0 torr | 18:1 | Very tapered |

It is noteworthy that the increase in selectivity and profile control is achieved without degradation of the reaction chamber cleanliness.

Typical techniques for increasing the selectivity of oxide to polysilicon is achieved through adjustment of the incoming gas stream mixture. This gas phase increase of polymer containing plasma results in very dirty reaction chambers. However, by adjustment of the backside helium cooling pressure reactor cleanliness is maintained, and the only polymer reaction significantly effected is the surface de-absorption of polymer which has been deposited. Thus, profile control is achieved without degradation of the reaction chamber cleanliness and the selectivity of oxide to polysilicon is improved, and both are achieved by the control of helium backside pressure.

It is found in a plasma etch system that the thermal oxide etch rate and the non-uniformity of the etching are very strong functions of the backside helium pressure. As the helium pressure is lowered, the thermal oxide rate increases and the non-uniformity of the etching is improved. The results are shown in Table III.

TABLE III

| HE PRESSURE | ETCH RATE A/MIN | UNIFORMITY |
|---|---|---|
| 0 | 1017 | 261.8% |
| 2.8 | 4530 | 3.5% |
| 5.8 | 4203 | 8.2% |
| 8.7 | 3922 | 11.1% |
| 10.8 | 3900 | 11.5% |
| 12.7 | 3727 | 17.1% |

Wafers for the results shown in Table III were photoresist patterned thermal oxide wafers. The goal is an etch rate of approximately 4,500Å per minute on a thermal oxide with uniformity of about 3% (3–$\Sigma$). As can be seen, at a helium pressure of greater than 2.0 torr the contact etch rate and non-uniformity are unexpectedly superior.

While the invention has been described in terms of various preferred embodiments, the skilled artisan will appreciate the various modifications, substitutions, omissions and changes which may be made without departing from the spirit thereof. The descriptions of subject matter in this disclosure are illustrative of the invention and are not intended to be construed as limitations upon the scope of the invention.

What is claimed is:

1. A method of increasing the rate and uniformity of silicon dioxide etching during the dry non-isotropic etching of a oxide layer on the surface of a silicon wafer which comprises:

(a) placing a patterned resist layer over the oxide layer found on the surface of said silicon wafer so as to define areas where the oxide layer is exposed and areas where the oxide layer is covered by the resist layer;

(b) placing the silicon wafer prepared in step (a) in the wafer holder of an etching reactor;

(c) removing the exposed oxide layer from the surface of the silicon wafer by dry non-isotropic etching employing wafer backside cooling by means of helium gas flow to the backside of the wafer holder, wherein the helium gas flow is adjusted to maintain a backside pressure greater than about 2 torr and less than about 10 torr to control the rate and uniformity of etching.

2. A method according to claim 1 wherein said etching reactor is a plasma etching reactor.

3. A method according to claim 1 wherein employing wafer backside cooling comprises introducing gas to the backside of said wafer holder wherein the gas consists essentially of helium.

4. A method according to claim 1 wherein wafer backside cooling maintains said wafer at a constant temperature.

5. A method according to claim 3 wherein said backside pressure is greater than about 2 torr and equal to or less than about 5.8 torr.

6. A silicon wafer containing patterned layers of silicon dioxide on the surface thereof made according to the method of claim 1.

7. A method for controlling the taper of a profile etched in silicon dioxide during the dry non-isotropic etching of a silicon dioxide layer on the surface of a silicon wafer which comprises:

(a) placing a patterned resist layer over the oxide layer found on the surface of said silicon wafer so as to define areas where the oxide layer is exposed and areas where the oxide layer is covered by the resist layer;

(b) placing the silicon wafer prepared in step (a) in the wafer holder of an etching reactor;

(c) removing the exposed oxide layer from the surface of the silicon wafer by dry non-isotropic etching employing wafer backside cooling by means of helium gas flow to the backside of the wafer holder, wherein the helium gas flow is adjusted to maintain a backside pressure greater than about 3 torr to control the taper of the profile.

8. A method according to claim 7 wherein said helium backside pressure is greater than about 10 torr.

9. A method according to claim 7 wherein employing wafer backside cooling comprises introducing gas to the backside of said wafer holder wherein the gas consists essentially of helium.

10. A method according to claim 7 wherein wafer backside cooling maintains said wafer at a constant temperature.

11. A silicon wafer containing a patterned layer of silicon dioxide on its surface made according to the method of claim 8.

12. A method for controlling the dimension and uniformity of etched structures during the dry non-isotropic etching of a polycide or polysilicon layer on the surface of a silicon wafer which comprises:

(a) placing a patterned resist layer over the polycide or polysilicon layer found on the surface of said silicon wafer so as to define areas where the polycide or polysilicon layer is exposed and areas where said layer is covered by the resist layer;

(b) placing the silicon wafer prepared in step (a) in the wafer holder of an etching reactor;

(c) removing the exposed polycide or polysilicon layer from the surface of the silicon wafer by dry non-isotropic etching employing wafer backside cooling by means of a helium gas flow to the backside of the wafer holder, wherein the helium gas flow is adjusted to maintain a backside pressure greater than about 3 torr to control the dimension and uniformity of etched structures.

13. A method according to claim 12 wherein said helium backside pressure is greater than about 10 torr.

14. A method according to claim 12 wherein said polysilicon or said polycide layer has a thickness from about 0.05 to 1.0 microns.

15. The method of claim 12 wherein said polycide is tungsten silicide.

16. The method of claim 12 wherein said patterned resist layer is from about 0.5 to about 2 microns in thickness.

17. The method of claim 12 wherein the dry non-isotropic etching method utilizing helium backside cooling is reactive ion etching.

18. A silicon wafer containing a patterned layer of polycide or polysilicon on its surface made according to the method of claim 12.

19. A method according to claim 12 wherein wafer backside cooling maintains said wafer at a constant temperature.

20. A method according to claim 12 wherein employing wafer backside cooling comprises introducing gas to the backside of said wafer holder wherein the gas consists essentially of helium.

21. A method according to claim 20 wherein said backside pressure is greater than about 14 torr.

* * * * *